United States Patent [19]

Kato et al.

[11] Patent Number: 5,428,569
[45] Date of Patent: Jun. 27, 1995

[54] NON-VOLATILE SEMICONDUCTOR MEMORY DEVICE

[75] Inventors: Hideo Kato, Kawasaki; Hiroto Nakai, Yokohama; Masamichi Asano, Tokyo; Kaoru Tokushige, Yokohama, all of Japan

[73] Assignee: Kabushiki Kaisha Toshiba, Kawasaki, Japan

[21] Appl. No.: 38,985

[22] Filed: Mar. 29, 1993

[30] Foreign Application Priority Data

Mar. 27, 1992 [JP] Japan .................................. 4-068960

[51] Int. Cl.$^6$ ................................................. G11C 7/00
[52] U.S. Cl. ..................... 365/185; 365/189.01; 365/200; 365/218
[58] Field of Search ............... 365/185, 218, 189.01, 365/200, 201, 900, 189.07

[56] References Cited

U.S. PATENT DOCUMENTS

| | | | |
|---|---|---|---|
| 4,460,982 | 7/1984 | Gee et al. | 365/218 |
| 4,912,677 | 3/1990 | Itano et al. | 365/185 |
| 4,937,787 | 6/1990 | Kobatake | 365/185 |
| 4,942,576 | 7/1990 | Busack | 365/201 |
| 5,053,990 | 10/1991 | Kreifels et al. | 365/218 |
| 5,132,937 | 7/1992 | Tudd et al. | 365/201 |
| 5,134,583 | 7/1992 | Matsuo et al. | 365/200 |
| 5,138,580 | 8/1992 | Farrugia et al. | 365/218 |
| 5,151,881 | 9/1992 | Vajigaya et al. | 365/201 |
| 5,163,021 | 6/1992 | Mehrotra et al. | 365/185 |
| 5,164,918 | 11/1992 | Ogino et al. | 365/201 |

FOREIGN PATENT DOCUMENTS 0409672  1/1991  European Pat. Off.

OTHER PUBLICATIONS

"Dichte Flash-EEPROMs Konkurrieren um den UV-EPROM-Sockel", Design & Elektronik, vol. 10, Ausgabe 21, Oct. 1988, pp. 97-100.

Primary Examiner—Joseph A. Popek
Assistant Examiner—Tan Nguyen
Attorney, Agent, or Firm—Foley & Lardner

[57] ABSTRACT

A non-volatile semiconductor memory device comprises: a plurality of memory cells for electrically rewriting data; a programming and erasing section for executing data writing programs and data erasing operation for the memory cells; a verifying section for discriminating whether a data is written in or erased from one of the memory cells properly whenever data are written to or erased from the memory cells; and an automatic control section for enabling the programming and erasing section to execute the data writing program and erasing operation again whenever the verifying section discriminates that data is not properly written to or erased from one of the memory cells, the data writing program or erasing operation being executed repeatedly by the number of times less than a user-defined maximum program execution or erasing operation number applied externally from the outside of the memory device. Further, the number of data writing and erasing operations can be outputted to the outside of the chip. Therefore, it is possible to optimize the limit of the data writing operation according to the chip samples and to detect the deterioration status of he chip externally from the chip. The reliability of a system using the memory devices can be improved, and further the chip exchange timing can be indicated to the user.

42 Claims, 17 Drawing Sheets

NON-VOLATILE SEMICONDUCTOR MEMORY DEVICE

BACKGROUND OF THE INVENTION

1. Field of the Invention

The present invention relates to a non-volatile semiconductor memory device to which data can be rewritten electrically.

2. Description of the Related Art

An EEPROM (Electrically Erasable Programable Read Only Memory) is well known as a ROM by which data once stored can be erased and further new data can be rewritten electrically. In this EEPROM, since no ultraviolet rays are required to erase stored data, being different from an EPROM, it is possible to erase and rewrite data electrically under the condition that the memory device is kept mounted on a board, so that this memory device is easy to use as various controlling apparatuses or as memory cards.

Recently, in particular, an EEPROM of NAND cell structure type has been developed as the EEPROM suitable for a larger capacity. In more detail, the EEPROM of NAND structure is provided with the following features: data writing and erasing operation can be realized on the basis of the tunnel effect, without injecting hot electrons, being different from the conventional memory cells of NOR cell type structure. Accordingly, the current passing through the memory cells is small and thereby the data can be rewritten in the unit of page. In other words, since a large quantity of data are erasable and rewritable, the memory device is usable as not only a memory cards but also is replaceable with a hard disk.

FIG. 1 shows two memory cell groups MCG of NAND structure each provided with 8 floating gates. In data read operation, the select gate (the word line WL (S)) of selected memory cells MC (1) and MC (2) are set to a low level ( referred to as "L" level, hereinafter ) and the select gates (the word lines WL (NS)) of the remaining 7 memory cells in the NAND cell groups are set to a high level (referred to as "H" level, hereinafter). Further, the gates (the select line SGD) of the select transistors T1 and the gates (the select line SGS) of the select transistors T2 are set to "H" level, respectively.

FIG. 2 shows a typical distribution of the threshold voltage of the non-volatile semiconductor memory device of NAND structure. In FIG. 2, the threshold voltages of the memory cells in which "0" data are written distribute on the positive side and further the threshold voltage of the "0" data cells is set to a value lower than the gate voltage ("H") of the non-selected transistors of the NAND cell groups. Therefore, when the threshold voltage of the selected memory cell MC (1) is positive (i.e., a data "0" is written), no current flows between the bit line BL (1) and the ground GND, so that the bit line BL (1) is set to "H" level. Further, when the threshold voltage of the selected memory cell MC (2) is negative (i.e., a data "1" is written), current flows between the bit line BL (2) and the ground GND, so that the bit line BL (2) is set to "L" level. Therefore, it is possible to read the data "0" or "1" of the memory cells MC (1) or MC (2) by sensing the voltage potentials of the bit lines BL (1) and BL (2) with a sense amplifier circuit.

The writing operation will be described hereinbelow with reference to FIG. 3. In the drawing, a high voltage (Vpp) of about 20 V is supplied to the select gate WL (S) of the selected memory cells from a row decoder. Further, an intermediate potential (VPI) of about 10 V is supplied to the select gates WL (NS) of the other remaining 7 non-selected memory cells. Under these conditions, the gate voltage (SGD) of the select transistors T1 is set to 12 V and the gate voltage of the select transistors T2 between the NAND cell group MCG and the source line is set to 0 V. Further, although not shown, 0 V is supplied to the select gates of the other NAND cell group. Under these conditions, when the bit line BL (1) is set to 0 V, the voltage potential difference between the select gate WL (S) of the selected memory cell MC (1) and the channel is set to 20 V, so that electrons are injected from the substrate to the floating gate only at the selected memory cell MC (1). At this time, in the other 7 memory cells of the same NAND cell group MCG (1), the voltage potential difference between the select gate and the channel is 10 V, so that electrons are not injected to the floating gates thereof. Further, when electrons are not injected to the selected memory cell MC (2); that is, "1" is required to be written, the voltage of VDPI (10 V) is supplied to the bit line BL (2). Under these conditions, electrons are not injected. In other words, it is possible to selectively write a data of "0" or "1", selectively.

The erasing operation will be described hereinbelow with reference to FIG. 4. In the erasing operation, the substrate is set to Vpp (about 20 V) and the select gate is set to 0 V, respectively. Under these conditions, electrons at the floating gate are extracted toward the substrate, so that a data is erased. In this case, the select lines SGD and SGS are set to Vpp (20 V) in order to reduce the gate stress at the select gates.

As described above, in the EEPROM of NAND structure, a data is written in dependence upon tunnel current. Accordingly, current flowing through the memory cells is extremely small in data writing operation, so that it is possible to write data to a great number (several hundreds to several thousands) of memory cells at the same time.

The data write and erasure sequences of the EEPROM of NAND type will be described with reference to FIGS. 5 and 6.

In the data write operation as shown in FIG. 5, first a data input command "80H" is inputted (in step S1) and further data to be written for one page are inputted (in step S2). The data are written until all the column addresses end (in steps S2 and S3). Here, a program command "10H" is inputted (in step S4). In this status, the chip is set to an automatic program mode. That is, control executes the program for writing a data (in step S5) and verifies the executed program; that is, the written data (in step S6). Whenever the program is executed normally and further verified, the number k of executed programs is incremented (in step S7) and further the incremented number k of programs is compared with a predetermined number n (in step S8). The above-mentioned procedure is repeated until all the bits are written properly. The number n of the repetitions is previously determined. On the basis of this repetition number, the chip is discriminated as being acceptable or not (non-defective or defective). In the data writing operation, a signal BUSY is outputted from a READY / BUSY terminal so that the writing operation can be known from the outside. After the data write operation ends normally, a flag read command "70H" is inputted (in step S9). Then, control reads the verified results stored in the internal register, and outputs the read verified results through an I/O terminal (in step S10). If the flag can be read (pass), the chip is discriminated as a non-defective product (in step S11). If cannot be read (fail), the chip is discriminated as a defective product (in step S12).

In the data erasing operation in FIG. 6, first an erase block input command "60H" is inputted (in step S1) and further erase block addresses are inputted (in step S2). Here, an erase command "DOH" is inputted (in step S3). In this status, the chip is set to an automatic erase mode. That is, control executes the erasing operation (in step S4) and verifies the executed erasing operation (in step S5). Whenever the erasing operation is executed and further verified, the number l of erasing operations is incremented (in step S6) and further the incremented number l of erasing operations is compared with a predetermined number n (in step S7). The number n of the repetitions is previously determined. On the basis of this repetition number, the chip is discriminated as being acceptable or not. In the data erasing operation, a signal BUSY is outputted from the READY / BUSY terminal so that the erasing operation can be known from the outside. After the erasing operation ends normally, a flag read command "70H" is inputted (in step S8). Then, control reads the verified results stored in the internal register, and outputs the read results through the I/O terminal (in step S10). If the flag can be read (pass), the chip is discriminated as a non-defective product (in step S11). If cannot be read (fail), the chip is discriminated as a defective product (in step S12).

In general, the characteristics of the EEPROM deteriorate markedly due to the deterioration of the oxide films, after the writing and erasing operation has been executed repeatedly. FIG. 7 shows an example of the data write and erase characteristics. This graph indicates that the time required for the memory cell to reach a predetermined threshold voltage increases with increasing number of data writing programs and data erasures (data rewriting times). Therefore, it is not preferable from the reliability standpoint to use the chip in which the above-mentioned time to the threshold voltage begins to increase beyond a usable limit.

In this case, however, there exists a problem in that it is difficult to discriminate the beginning of the deterioration in the chip characteristics (the time point at which the time required to reach the threshold voltage begins to increase) as far as the data are written and erased in the automatic mode.

Further, in the conventional memory devices, the limitation in the number of the data writing and erasing operations is fixedly determined (e.g., 100 times) with the use of a mask, irrespective the ship samples. However, since the data writing and erasing characteristics usually differ according to the production lot, there exists a problem in that the above-mention operation margin (the allowable write and erasing operation limit) differs according to the chip samples.

In other words, in the conventional non-volatile semiconductor memory device, when data are written and erased repeatedly in the automatic mode, it has been impossible to know the chip deterioration conditions from the outside.

Further, since the number of times for data writing and erasing operations is fixedly determined by use of a mask during the chip manufacturing process, irrespective of the chip samples of different lots, there exists a problem in that the operation margin to the above-mentioned number of usable times differs according to the chip samples.

SUMMARY OF THE INVENTION

Accordingly, it is the object of the present invention to provide a non-volatile semiconductor memory device which can detect the chip deterioration conditions from the outside of the chip and further the operation margin (limit) of the data writable and erasable times can be optimized according to the chip sample.

To achieve the above-mentioned object, the nonvolatile semiconductor memory device according to the present invention comprises: a plurality of memory cells for electrically rewriting data; programming means for executing data writing programs to said memory cells; verifying means for discriminating whether a data is written to one of said memory cells properly by said programming means or not whenever data are written in said memory cells; and automatic control means for enabling said programming means to execute the data writing program again whenever said verifying means discriminates that a data is not written properly to one of said memory cells; said data writing program being executed repeatedly by the number of times less than a maximum program execution number applied externally from the outside of the memory device.

Further, to achieve the above-mentioned object, the non-volatile semiconductor memory device according to the present invention comprises: a plurality of memory cells for electrically rewriting data; erasing means for erasing data in said memory cells; verifying means for discriminating whether a data is erased in one of said memory cells properly by said erasing means or not whenever data are erased in said memory cells; and automatic control means for enabling said erasing means to execute the data erasing operation again whenever said verifying means discriminates that a data is not erased properly in one of said memory cells; said data erasing operation being executed repeatedly by the number of times less than a maximum erasing operation number applied externally from the outside of the memory device.

The automatic control means is so configured as to rewrite and store the maximum program execution number applied externally, and further as to count and store the number of programs executed by said programming means and further output the stored number of executed programs to the outside of the memory device

DETAILED DESCRIPTION OF THE PREFERRED EMBODIMENTS

Figure 1:
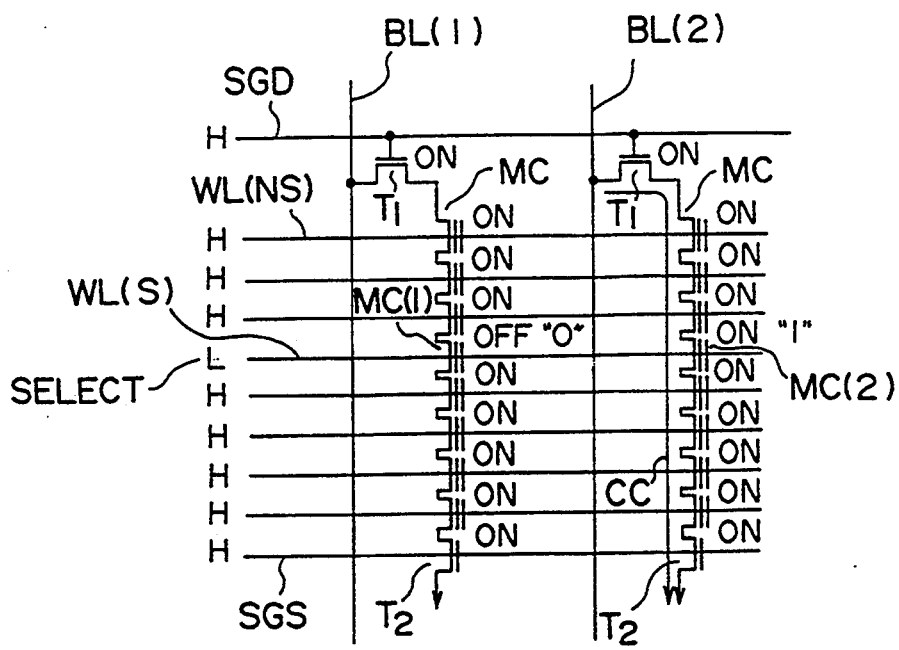
FIG. 1 is a circuit diagram showing an example of conventional memory devices.
Figure 2:
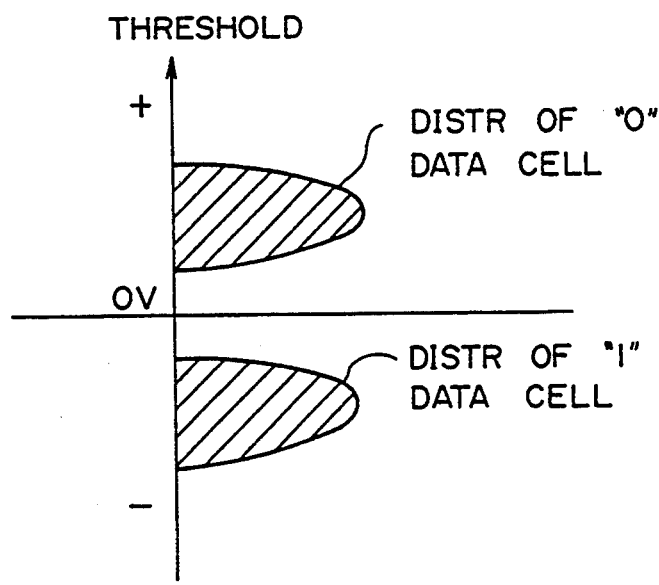
FIG. 2 is a graph showing a threshold distribution of the conventional memory cells.
Figure 3:
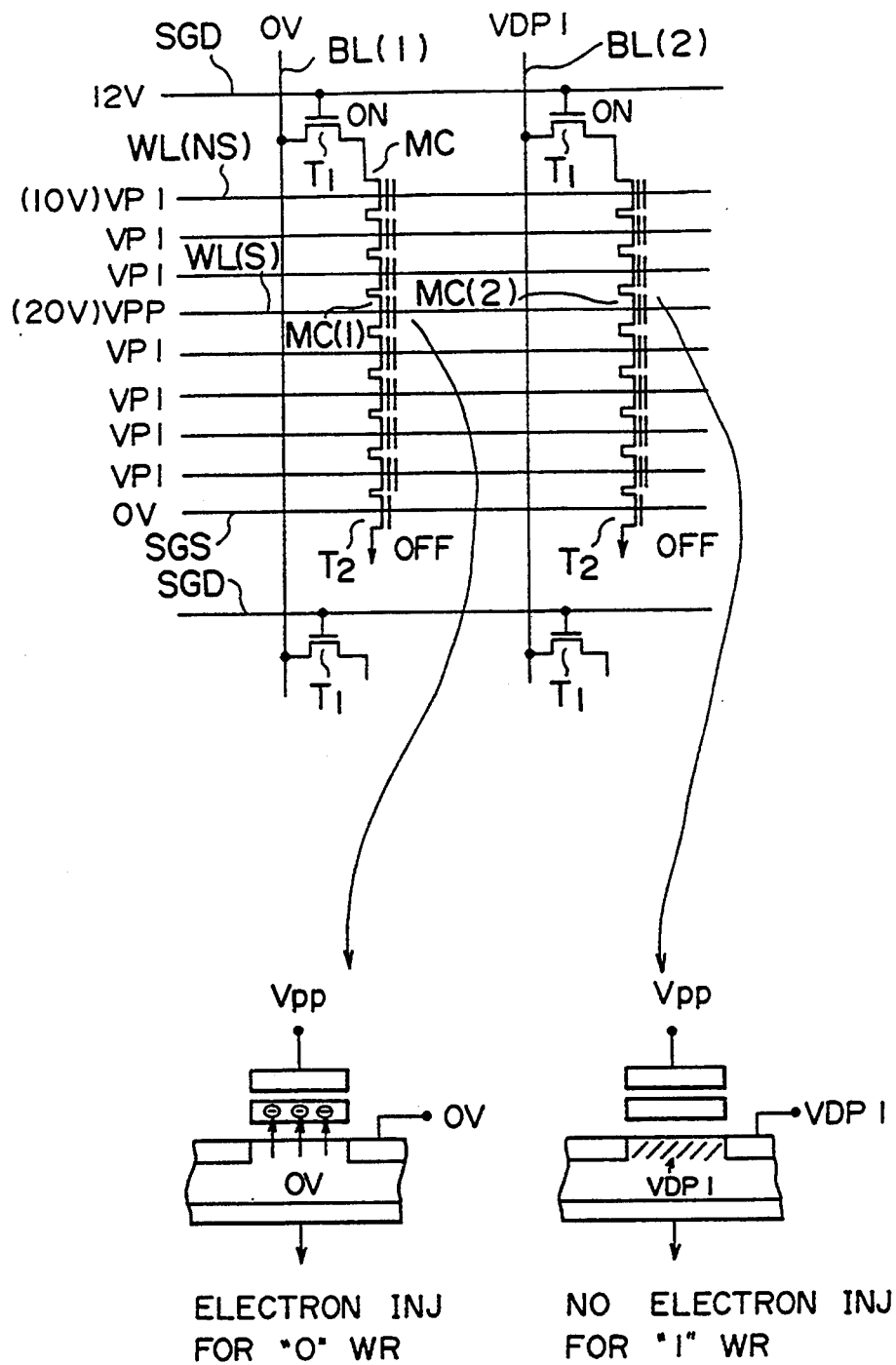
FIG. 3 is a circuit diagram showing the example of the conventional memory devices and a partial cross-sectional view thereof for assistance in explaining the data writing operation of electron injection.
Figure 4:
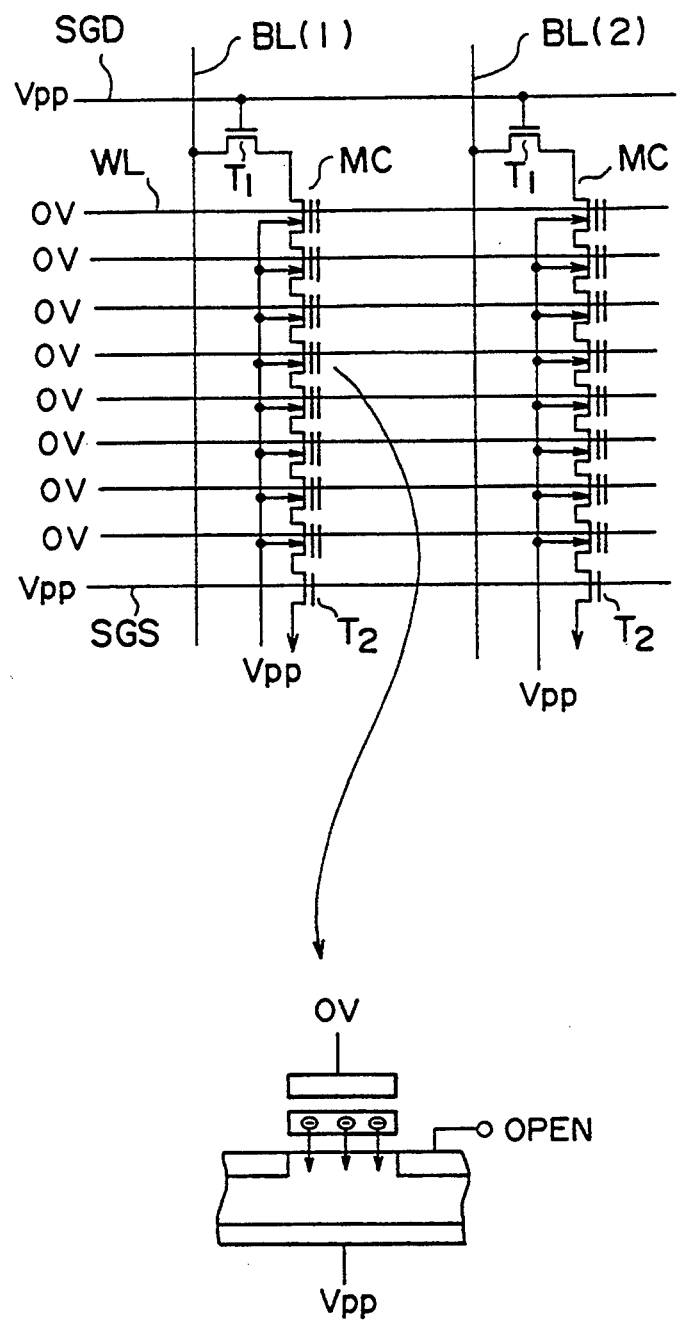
FIG. 4 is a circuit diagram showing the example of the conventional memory devices and a partial cross-sectional view thereof for assistance in explaining the data erasing operation of electron extraction to the substrate.
Figure 5:
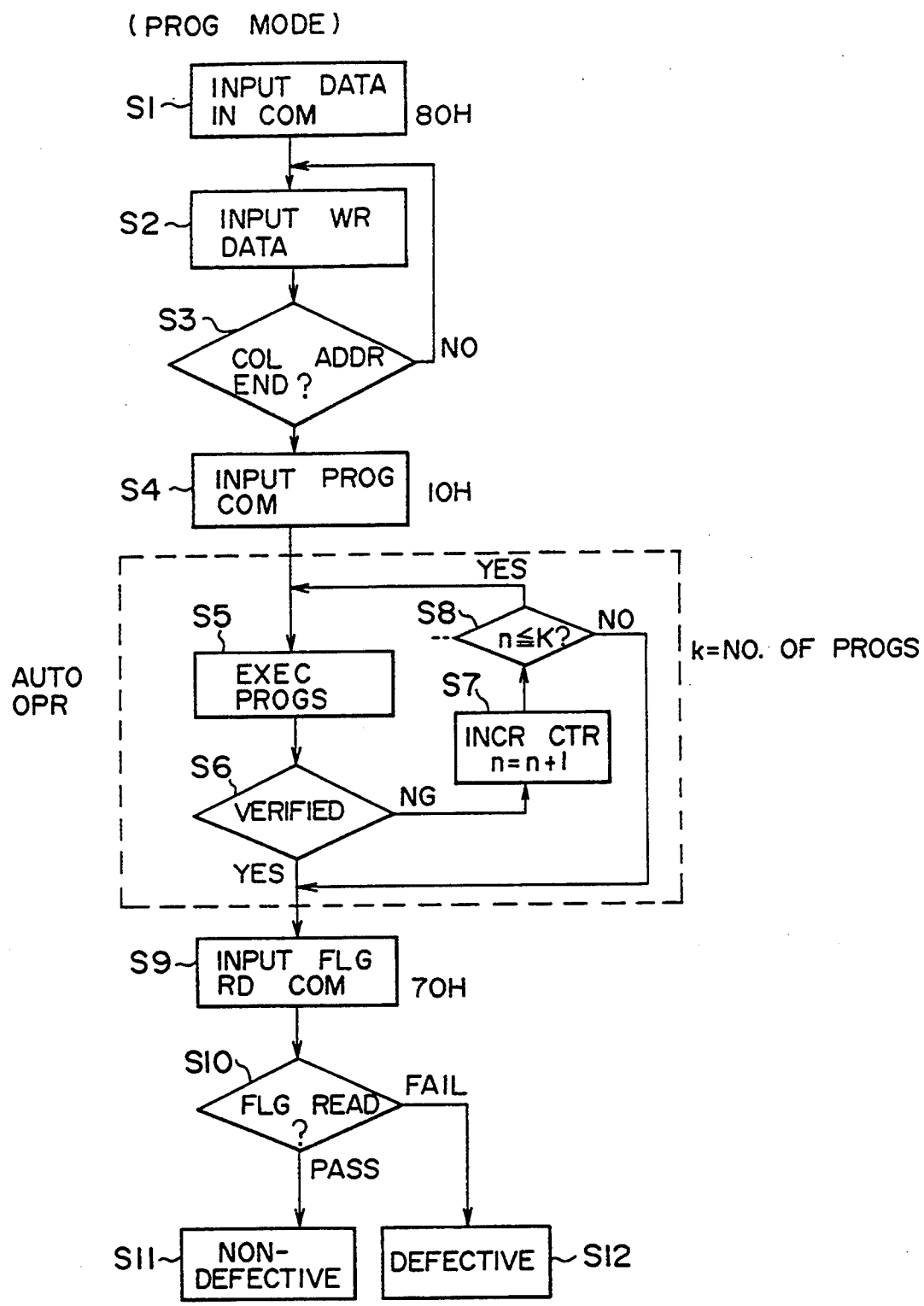
FIG. 5 is a flowchart for assistance in explaining the data writing operation of the conventional memory device.
Figure 6:
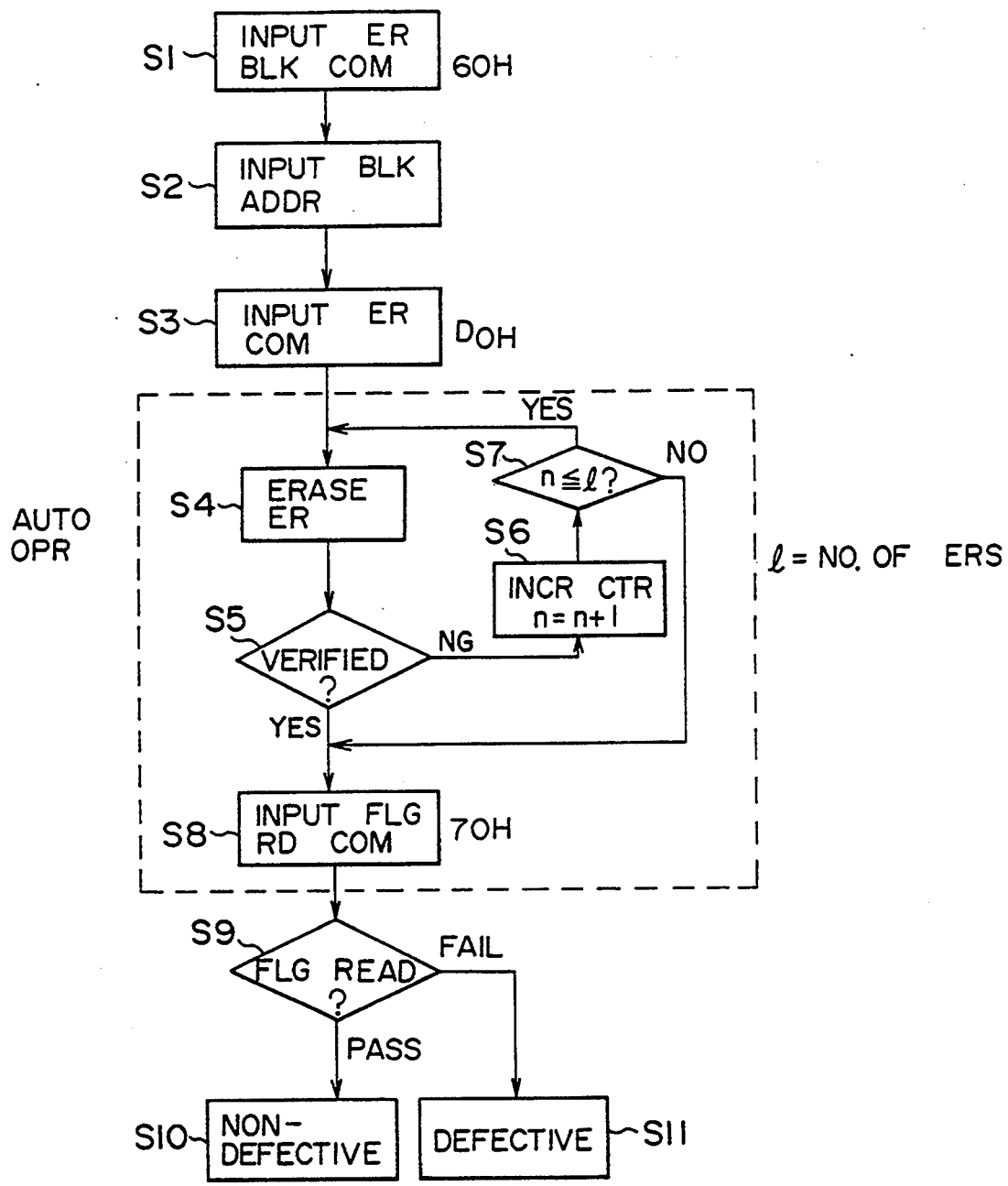
FIG. 6 is a flowchart for assistance in explaining the data erasing operation of the conventional memory device.
Figure 7:
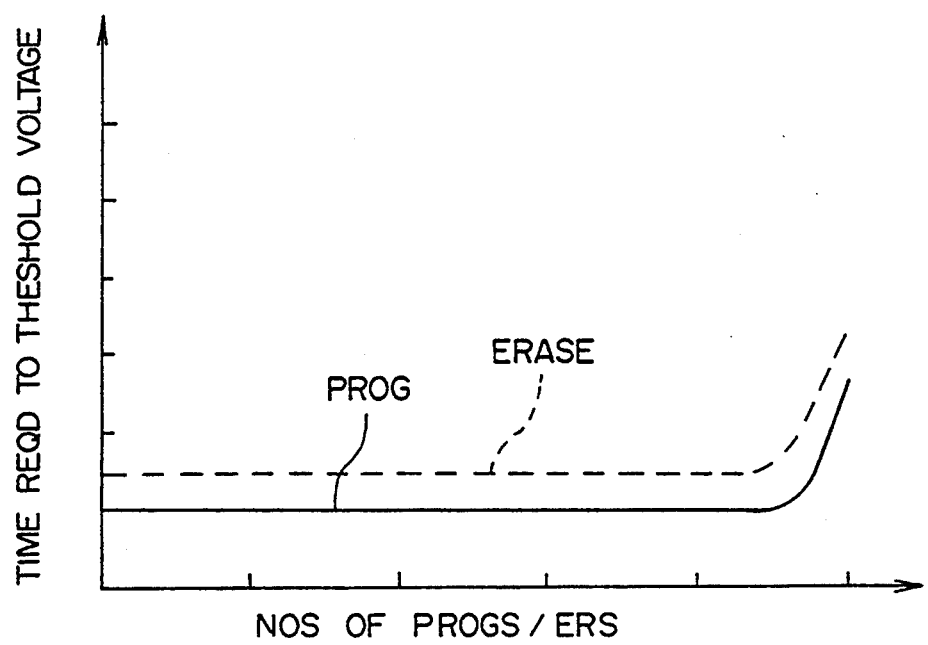
FIG. 7 is a graph showing the relationship between the number of program and erasing operation times and the time required for the memory cell to reach a predetermined threshold voltage.
Figure 8:
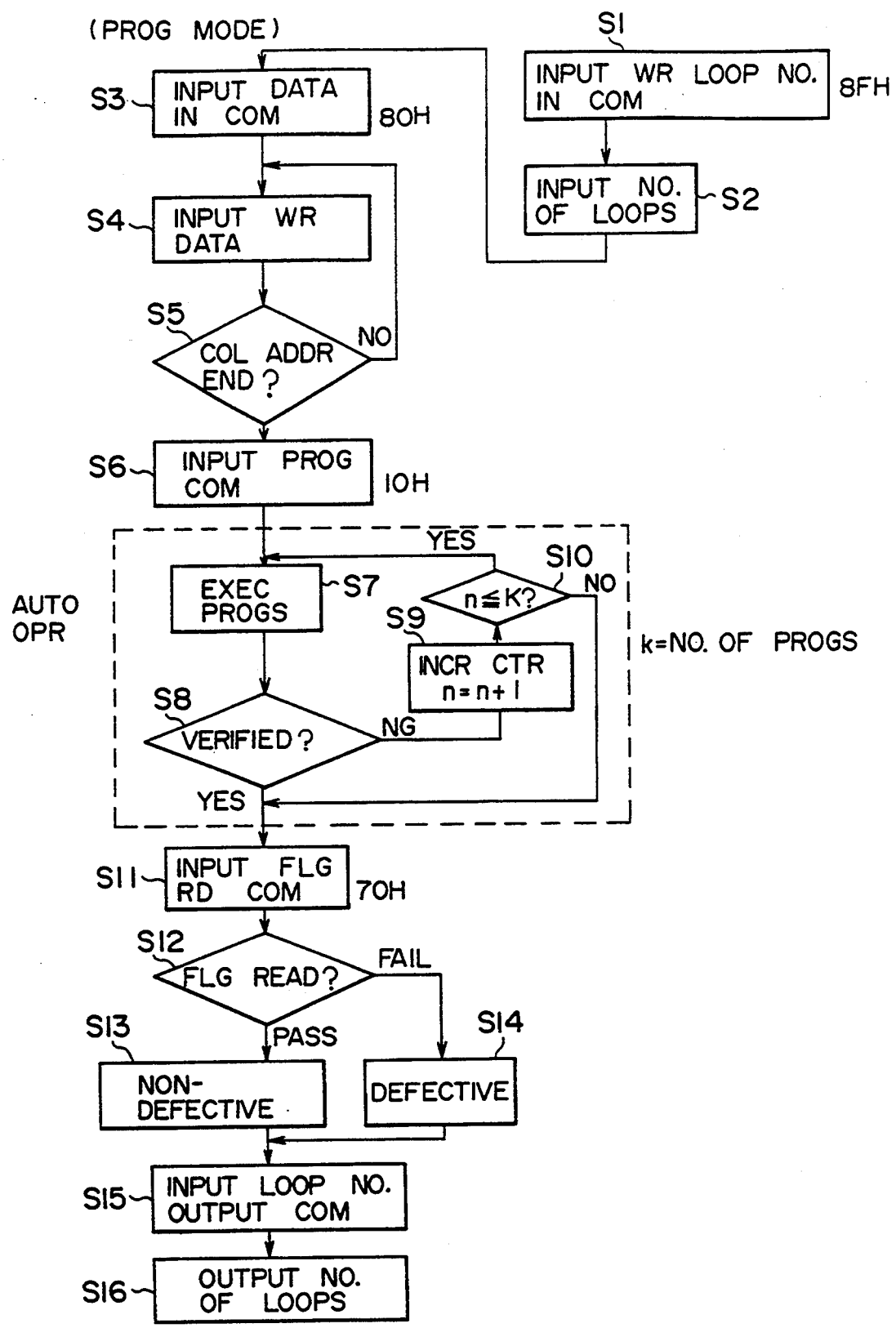
FIG. 8 is a flowchart for assistance in explaining the data writing operation of an embodiment of the memory cell according to the present invention.

An embodiment of the semiconductor memory device according to the present invention will be described hereinbelow with reference to the attached drawings. FIG. 8 is a flowchart for showing the sequence of the data writing program of the embodiment. In the embodiment, it is possible to input the number of data writing loops (a series of instructions executed repeatedly in accordance with the program) in the automatic data writing operation from the outside of the chip, and further to output the number of data writing loops to the outside of the chip after the data write operation has been executed.

In more detail, first a write loop number input command "8FH" is inputted through an I/O terminal (in step S1) and further a write loop number is inputted as a binary code (in step S2). The inputted data are latched by an internal latch circuit. Therefore, it is possible to change the maximum number of times at which the data writing operation is limited for each semiconductor chip according to the degrees of the characteristics of the chips. Thereafter, a serial data input command "80H" is inputted through the I/O terminal (in step S3). Then, all the data latched by the data latch circuit connected to the respective bit lines are set to data "1". Thereafter, a page address and a column head address indicative of the start of data writing operation are inputted and successively data to be written are inputted (in step S4). This operation is repeated until the last column address is inputted (in step S5). After the data input mode, a program command "10H" is inputted in the command input mode (in step S6). Then, the chip starts to write data in the memory cells (in step S7). In this data writing operation, the bit lines with a data "1" of the data register are set to a high potential of about 10 V, and the bit lines with a data "0" are set to 0 V. Therefore, electrons are injected to the memory cells connected to the bit lines with a data "0" of the data register and further selected by the word line, with the result that a data "0" is written in these memory cells. Here, control checks whether the data writing operation is executed normally or not (verify operation) (in step S8). If the normal data writing operation is not verified (NG) (in step S8), the program is executed again in the chip automatically. Further, whenever the data is written, this operation is counted by an internal counter and then incremented (in step S9). The incremented counter value is compared with the maximum number of times (inputted at the start of the data writing operation) (in step S10). Even after data have been written the maximum number of times, the chip in which data are not written normally is determined to be defective. Further, when the data writing operation is executed normally within the number of loops less than the maximum number of times, the number of loops is stored in the internal counter of the chip. During the data writing operation, a BUSY signal is outputted through a READY/BUSY terminal. Upon the end of the normal data writing operation, the READY signal is outputted automatically. To check whether the data writing operation ends normally, a flag read command "70H" is inputted in the command input mode to read the automatic verify results stored in the internal register (in step S11). That is, when the flag can be read (pass) (in step S12), the chip is determined to be non-defective (in step S15). When not read (fail) (in step S12), the chip is determined to be defective (in step S14). Successively, a loop number output command "5FH" is inputted in the command input mode (in step S15), so that it is possible to read the counter value as a binary code to the outside of the chip (in step S16).

Figure 9:
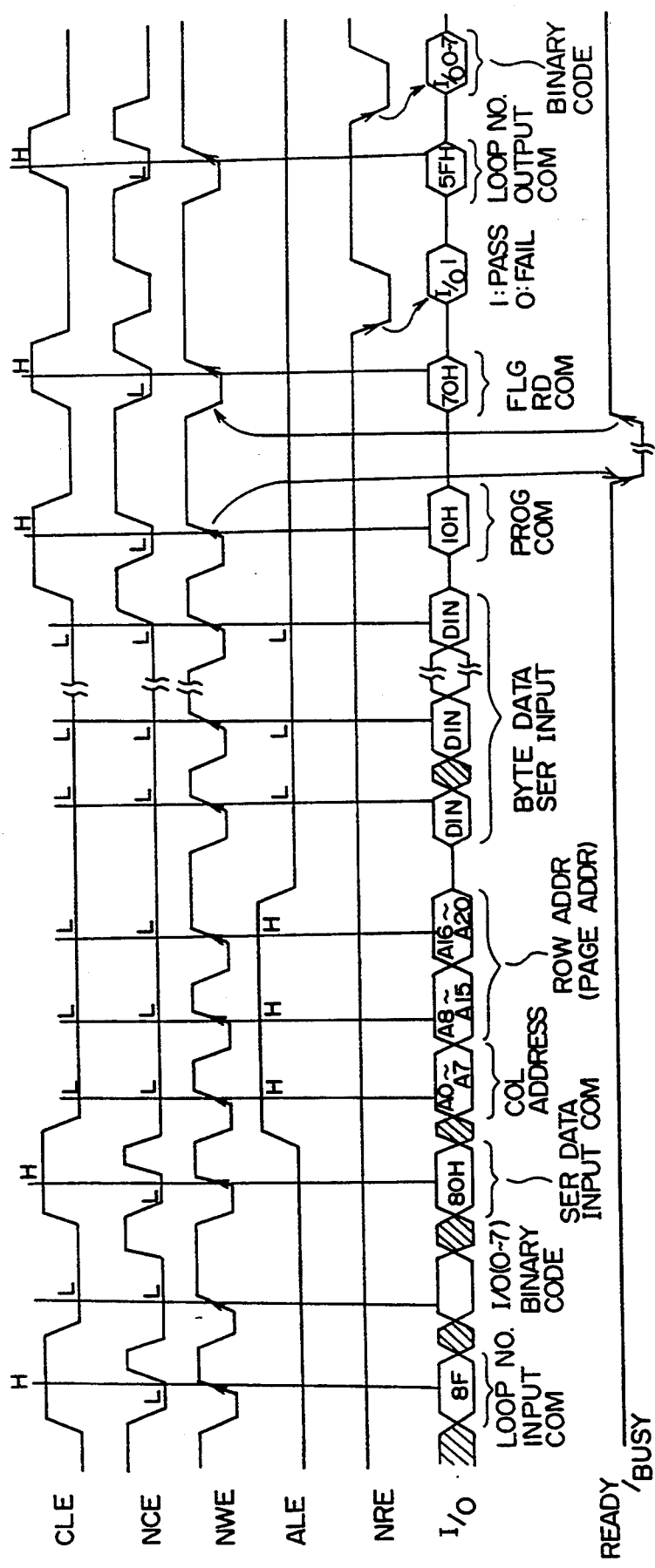
FIG. 9 is a timing chart for assistance in explaining the data writing operation of the embodiment of the memory cell according to the present invention.

FIG. 9 is a timing chart of control signals inputted externally from the outside to control the above-mentioned sequence. In the drawing, CLE, NWE, NCE, ALE and NRE are external control signals all inputted through the input pins to decide the chip operation mode, respectively. Further, the READY/BUSY signal represents whether the chip can be accessed or not. The external signal CLE decides the command input mode; the external signal ALE decides the address input mode; the external signal CE is a chip select signal; the external signal NWE serves as a clock signal for retrieving the respective input data in the command input mode, the address input mode, and the data input mode, respectively. Further, the control signal NRE is a clock signal provided with functions for incrementing the address and enabling the output buffer when the address is read continuously from the addresses inputted in the data read operation.

Figure 10A:
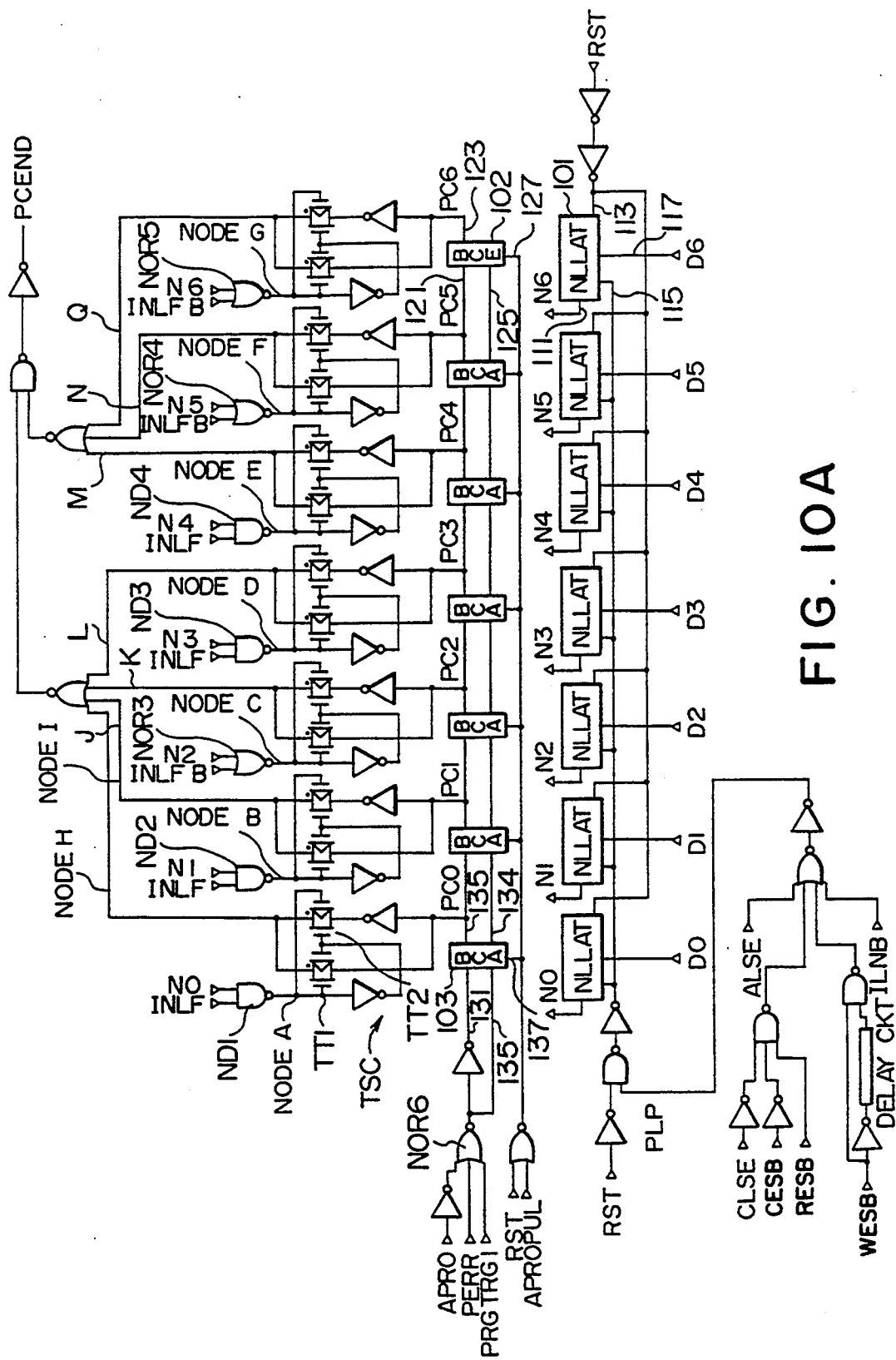
FIGS. 10A, 10B and 10C are circuit diagrams showing the embodiment of the memory device according to the present invention.
Figure 10B:
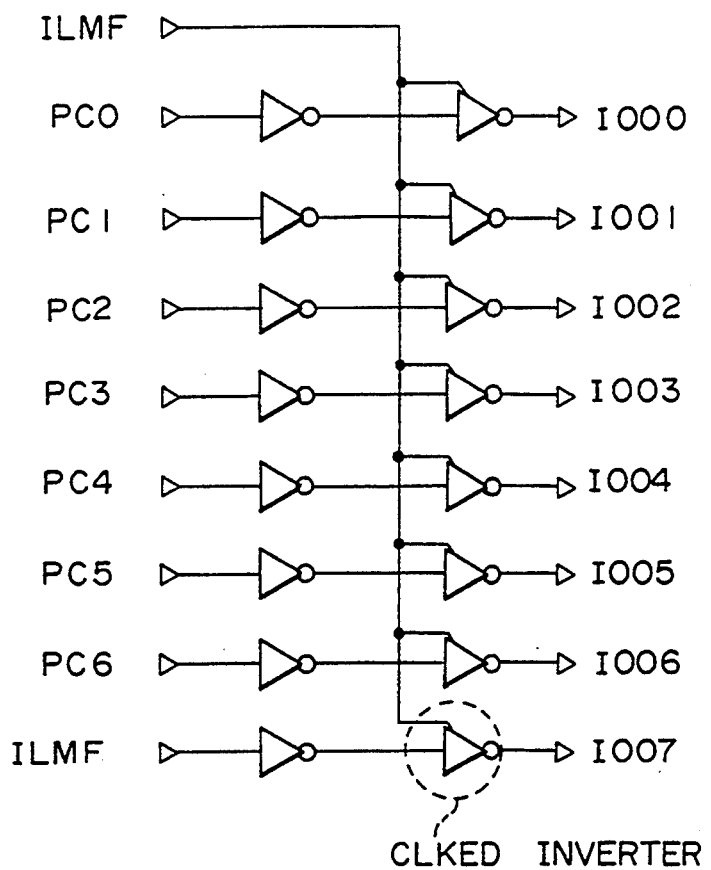
Figure 10C:
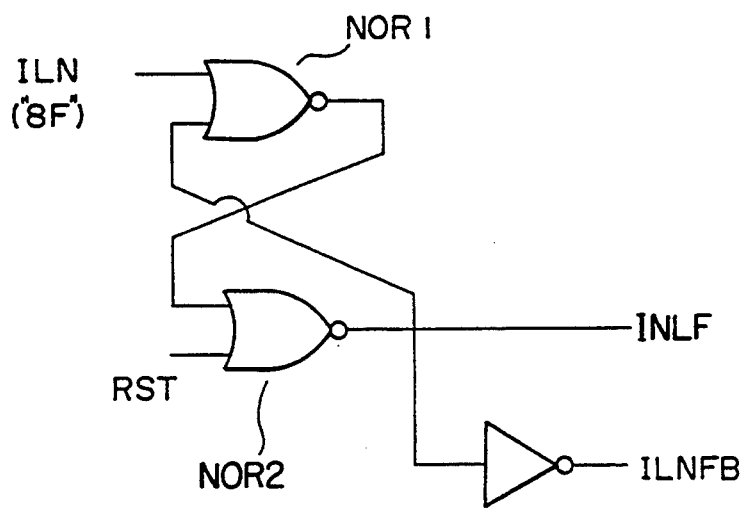
Figure 12:
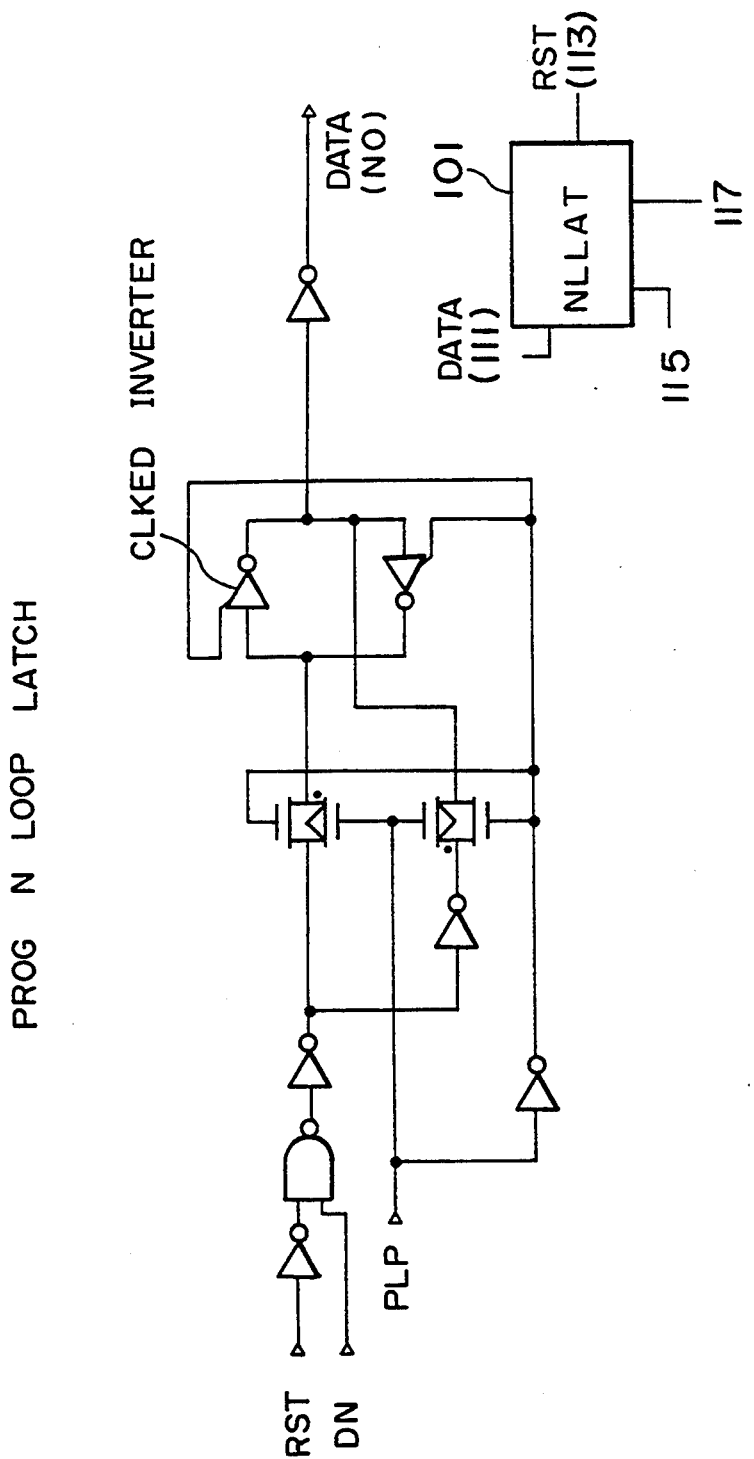
FIG. 12 is a circuit diagram showing an example of the program number loop latch circuit.
Figure 13:
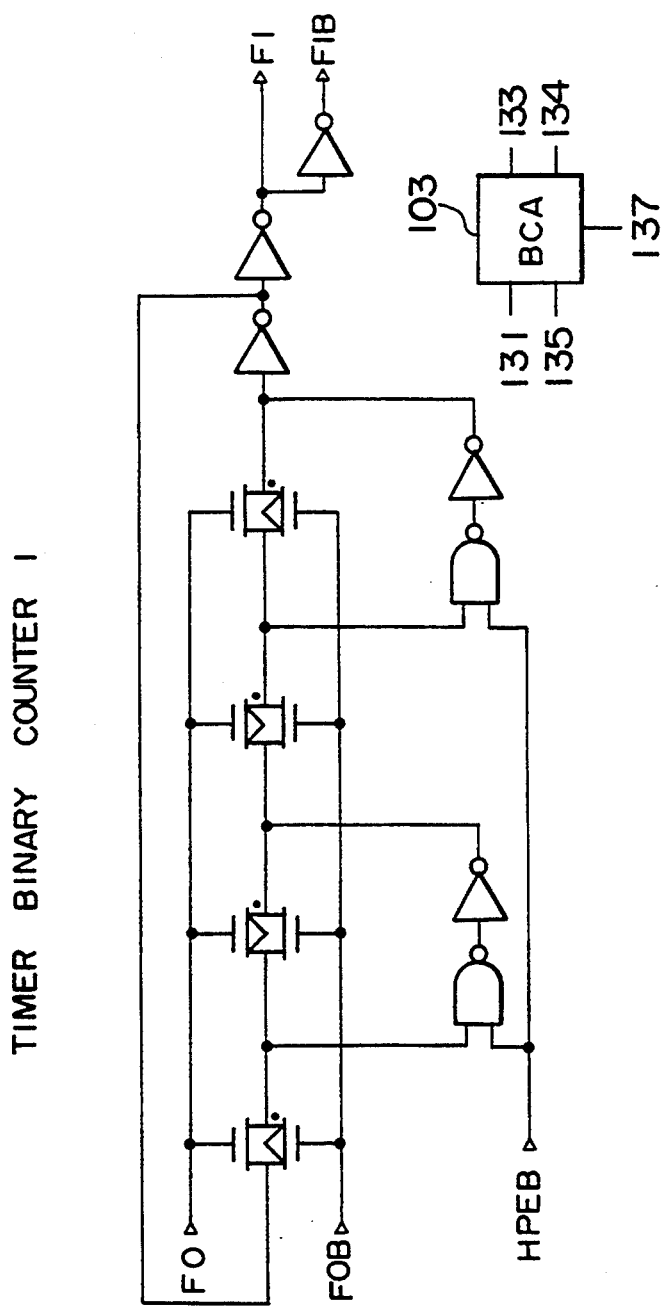
FIG. 13 is a circuit diagram showing an example of the timer binary counter.
Figure 14:
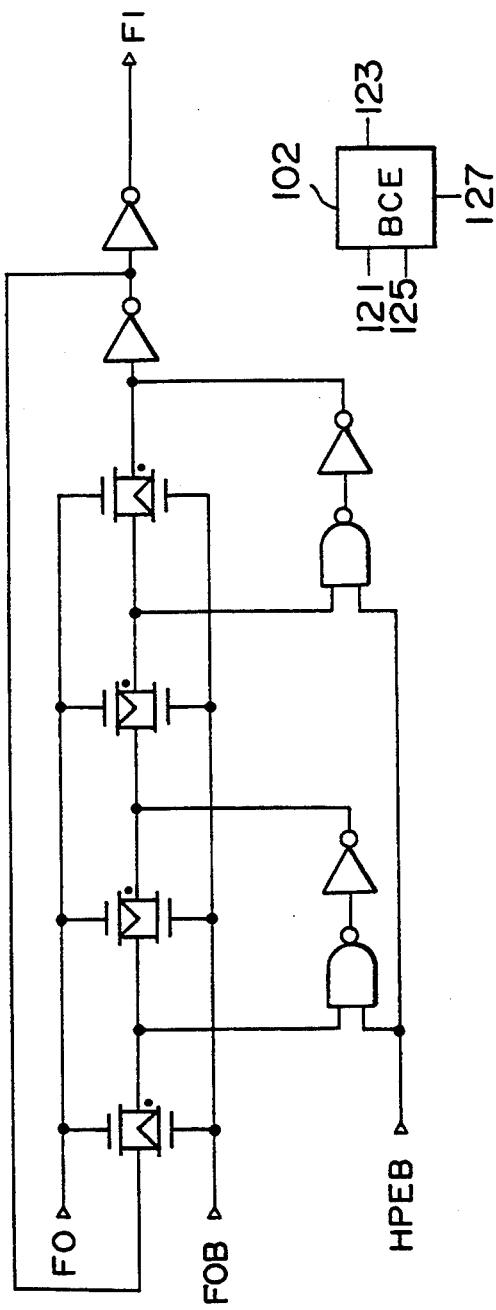
FIG. 14 is a circuit diagram showing another example of the timer binary counter.

FIG. 10A shows a maximum loop number input circuit of the semiconductor memory device according to the present invention; FIG. 10B is a maximum loop number outputting circuit; and FIG. 10C is a counter circuit. In FIG. 10A, a symbol NLLAT denotes a program number loop latch circuit as shown in FIG. 12; a symbol BCA denotes a timer binary counter 1 as shown in FIG. 13; and a symbol BCE denotes a timer binary counter 2 as shown in FIG. 14.

Figure 11A:
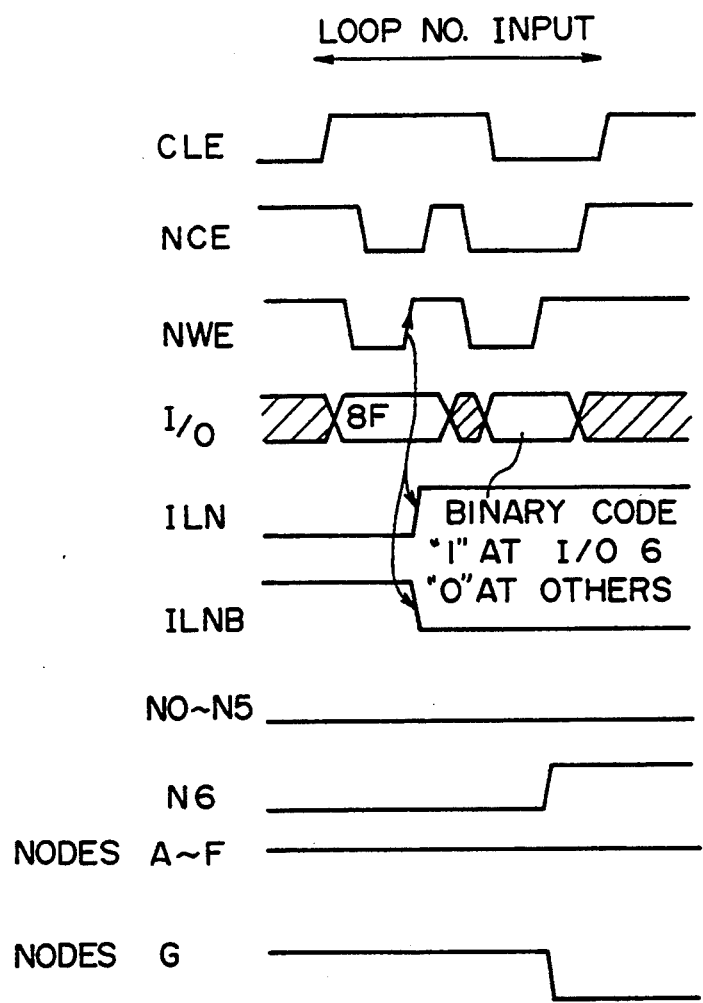
FIG. 11A, 11B and 11C are timing charts for assistance in explaining the operation of the embodiment of the memory cell according to the present invention.
Figure 11B:
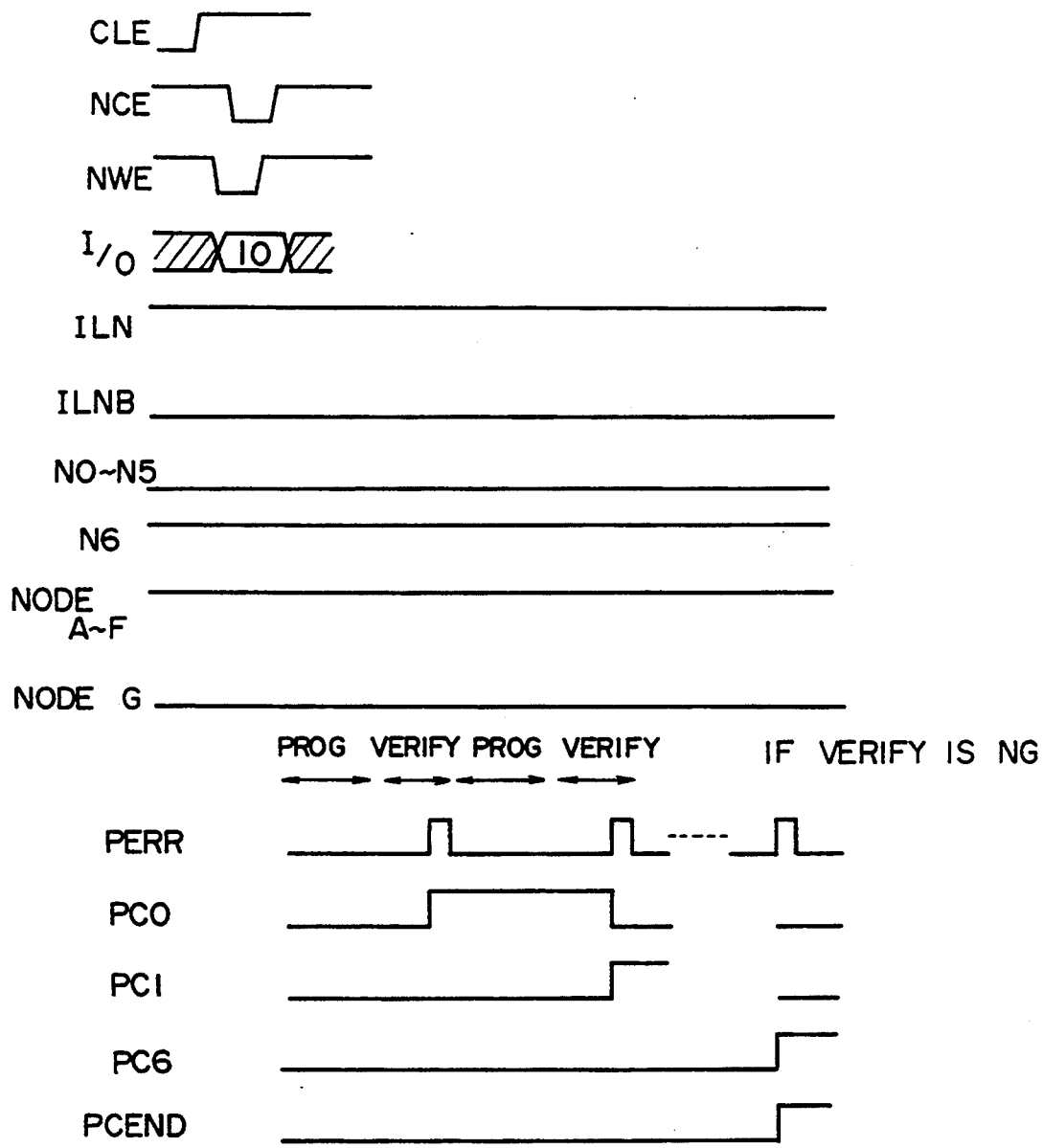
Figure 11C:
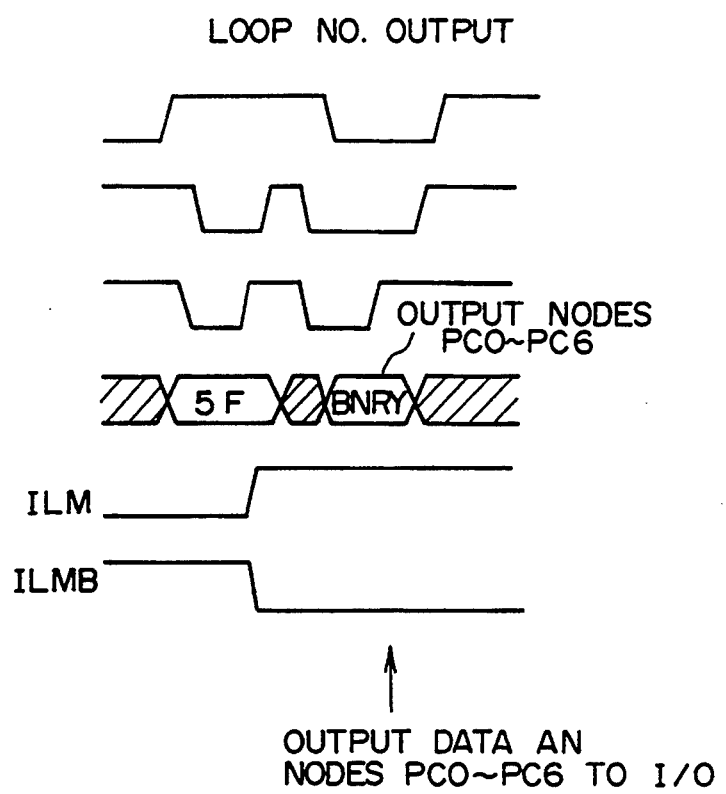

The operation of the circuit as shown in FIG. 10A will be described will be described hereinbelow with reference to timing charts as shown in FIGS. 11A, 11B and 11C.

First, the operation of inputting the maximum loop number will be described. When the loop number input command "8FH" is inputted in the command input mode, the signal ILN is set to "H" level and the signal ILNB is set to "L" level, and both the signals are latched by a flip-flop circuit composed of two NOR gates NOR 1 and NOR 2. Further, when the signal ILN is set to "H" level and the signal ILNB is set to "L" level, NAND gates ND 1 to ND4 and the NOR gates NOR 2 to NOR 5 are all activated. Under these conditions, the signal CLSE changes to "L" level; the signal CESB changes to "L" level; and the signal RESB changes to "H" level. Therefore, when the signal WESB is changed as "H" level→"L" level→"H" level, the maximum loop number given to a data input/output pad at this time is inputted to the loop latch circuit NLLAT as a binary code. According to the latched data, nodes N0 to N6 are set. The set signals N0 to N6 are inputted to the gates of the NAND gates ND1 to ND4 and NOR gates NOR2 to NOR5, respectively, to decide which of transistors TT1 and TT2 in a transmission circuit TSC provided for each I/O is turned on. By this setting, it is possible to determine whether the outputs PC0 to PC6 of the binary counter are inverted or not. By this operation, the setting of the loop number is completed.

The operation of counting the number of programs in the program operation will be described hereinbelow. When the automatic program command "10H" is inputted in the command input mode, the chip repeats the operation of "program"→"verify"→"program" until one-page data writing operation has been verified or until the number of verifications reaches the number of the maximum loops. When the command "10H" is inputted, a signal APRO changes to "H" level, and the NOR gate NOR6 waits an input. The signal PERR is an error pulse signal outputted when even a single bit is not written normally within a single page in the verify operation. Being triggered by this error pulse, the binary counter is incremented one by one; that is, the node PCO is set to "H" level when triggered in response to the first error pulse signal PERR. Under these conditions, the other PC1 to PC6 are at "L" level. Accordingly, the node H is at "H" level; the nodes from I to N are at "L" level; and the node 0 is at "H" level (because the node N6 is at "H" level and therefore an inversion signal of the node PC6 is outputted), so that the signal PCEND is at "L" level. When this signal PCEND is at "L" level, since this indicates that the number of programs does not reach the maximum number of loops, the program is executed again. After the program has been executed, the executed program is verified. If NG again and the trigger signal PERR is outputted, the node PCO is set to "H" level and the nodes PC2 to PC6 are set to "L" level. At this time, the node H is at "L" level; the node I is at "H" level; the nodes J to N are at "L" level; the node 0 is at "H" level, so that the signal PCEND is at "L" level and thereby the program is further executed again. As described above, the trigger signals PERR are outputted, until the data are written normally and the verify results become YES, in order to increment the counter. When the node PC6 becomes "H" level, since this indicates that data are written 64 (=$2^6$) times, the nodes PC0 to PC5 are at "L" level and the node PC6 is at "H" level, so that the nodes H to 0 change all to "L" level and thereby the signal PCEND changes to "H" level. That is, since this indicates that data are written the maximum loop times, the data writing operation stops. Further, when data are written normally before reaching the maximum number of loops, the program operation ends with the counter value kept held. In this embodiment, it is possible to set the number of program executions to 128 times at the maximum. Thereafter, the number of loops is read out of the chip. That is, when the loop number output command "5FH" is inputted in the command input mode, the signal ILM is at "H" level and the signal ILMB is at "L" level, so that data at the nodes PC0 to PC6 in the counter are outputted through an output buffer as a binary code to the outside of the chip.

FIG. 12 shows an example of the loop number latch circuit. The latch circuit composed of a clocked inverter. The latch circuit is initialized by a signal RST. A latch data is inputted as a signal DN. When a signal PLP changes from "H" level→"L" level→"H" level, the inputted data is latched by the clocked inverter. Further, the latched data can be outputted as a signal DATA.

FIGS. 13 and 14 show examples of the ordinary counter circuits, and the description thereof is omitted herein.

Figure 15:
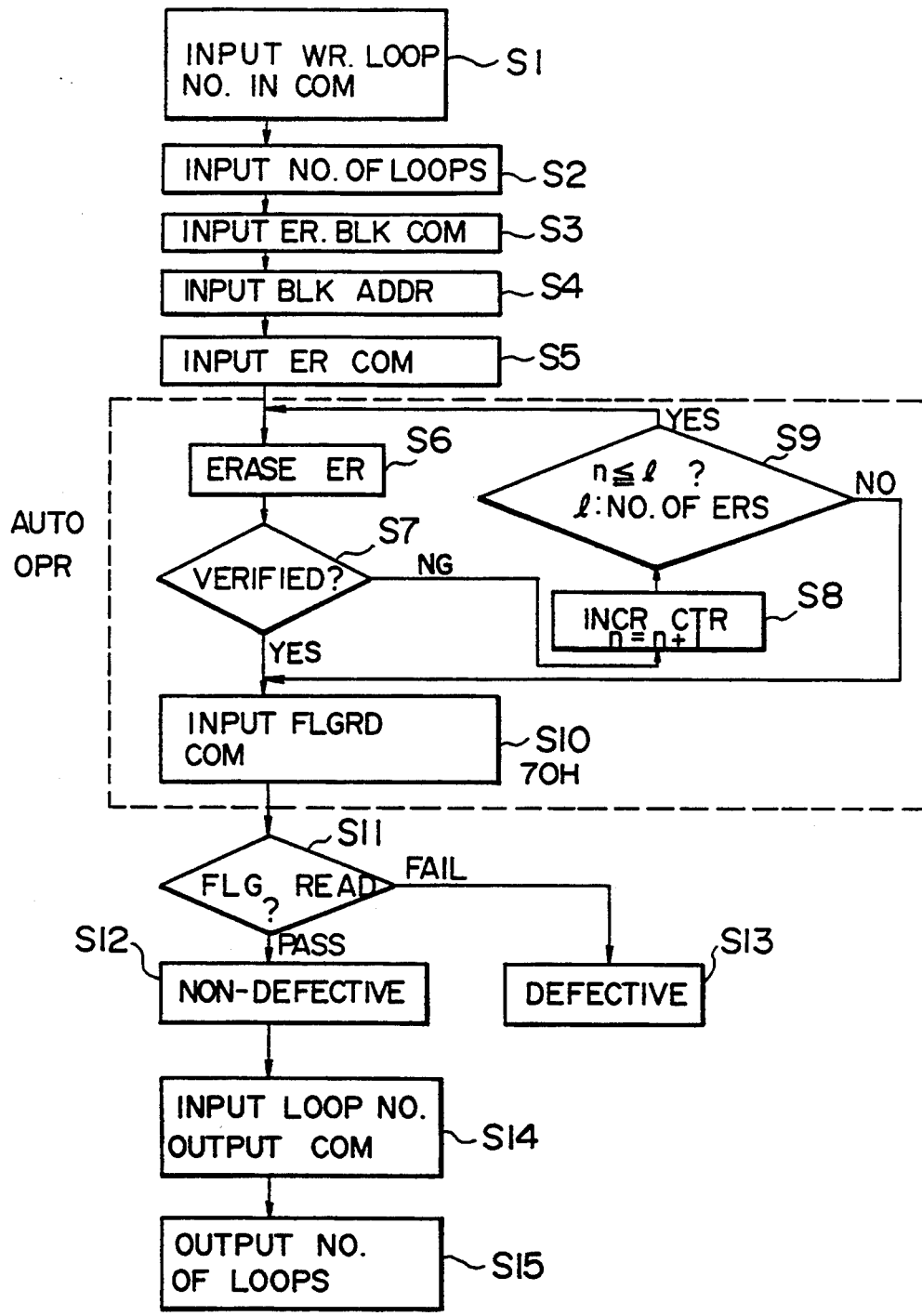
FIG. 15 is a flowchart for assistance in explaining the data erasing operation of an embodiment of the memory cell according to the present invention.

The data writing operation has been explained. The data erasing operation is almost the same as above, as shown in FIG. 15. In comparison between FIGS. 8 and 15, the different points are as follows: the column address comparison step S5 shown in FIG. 8 is not necessary and further the program execution step S7 shown in FIG. 8 is replaced with the erasure execution step S6 shown in FIG. 15. Therefore, another circuit configuration almost the same as that for the data writing operation is formed in the same chip for executing the data erasing operation.

As described above, in the memory device according to the present invention, it is possible to monitor the deterioration with the .passage of time due to repeated data writing and erasing operation, by directly outputting the number of data writing operations and the number of data erasing operations to the outside of the chip; that is, to read the deterioration from the external system side which uses the chip. In other words, there exists such an advantage that the user can directly know the deterioration condition or the life of the chip.

In practice, when the user knows the deterioration of the memory cells by reading out the number of data writing repetitions, the user can replace the block including the deteriorated memory cells with another block of the same chip or another block of another chip, thus improving the reliability of the memory cells without destroying data contents. Further, when a number of deteriorated blocks or deteriorating blocks are included in a single chip, it is of course possible to replace the chip with a new chip. Further, where a memory card, a memory board or a semiconductor disk is composed of a plurality of chips, it is possible to estimate the timing of exchanging the memory card, the memory board, or the semiconductor disk on the basis of the deterioration condition of the memory cells in the chip.

In addition it is also possible to use the block including many non-deteriorated memory cells with priority, by reading the number of data writing repetitions. In other words, the block including many non-deteriorated memory cells is used with .priority as compared with the block including many deteriorated memory cells. In this case, it is possible to use the memory cells within the chip evenly so that the memory cells deteriorate uniformly, in order to lengthen the practical life time of the chip.

Further, since the maximum loop number can be set chip by chip, it is possible to set the optimum value for each chip without repeating the program/erasure operation wastefully.

The memory device has been explained with respect to its application only to the flash EEPROM of NAND type. Without being limited thereto, the present invention can be of course applicable to any electrically erasable flash EEPROM, irrespective of NAND type, NOR type, or other types in which 0 V or a negative voltage is applied to the gates for erasing operation.

According to the present invention, it is possible to provide such a non-volatile semiconductor memory device such the deterioration status of the chip can be detected externally from the chip and additionally the operation margin (limit) of the number of data writing and erasing repetition can be set to an optimum value according to the ship samples of different lots.

What is claimed is:

1. A non-volatile semiconductor memory device, comprising:
   a plurality of memory cells for electrically rewriting data;
   programming means for executing data writing programs to write data to said memory cells;
   verifying means for discriminating whether or not data is written to one of said memory cells properly by said programming means whenever data are written in said memory cells; and
   automatic control means for enabling said programming means to execute a data writing program again whenever said verifying means discriminates that a data is not written properly to one of said memory cells,
   said data writing program being executed repeatedly a number of times up to a user-defined maximum program execution number applied externally from outside of the memory device;
   wherein said automatic control means is so configured as to rewrite and store the maximum program execution number applied externally.

2. The device of claim 1, wherein said automatic control means is so configured as to count and store the number of programs executed by said programming means and further output the stored number of executed programs to the outside of the memory device.

3. The device of claim 2, wherein said automatic control means compares the number of programs executed by said programming means with the maximum program execution number applied from the outside of the memory device to decide whether the same program is to be executed again or not on the basis of the comparison result.

4. The device of claim 3, wherein said automatic control means inputs the maximum program execution number from the outside and outputs the number of executed programs to the outside in response to inputted commands, respectively.

5. The device of claim 4, wherein the data writing program is executed for each page.

6. The device of claim 5, wherein the data writing program is executed beginning from a memory cell corresponding to a write start head address of each page.

7. The device of claim 6, wherein a BUSY signal indicative of data write program execution is outputted when the data writing program is being executed.

8. A non-volatile semiconductor memory device comprising:
   a plurality of memory cells for electrically rewriting data;
   programming means for executing data writing programs to write data to said memory cells;
   verifying means for discriminating whether or not data is written to one of said memory cells properly by said programming means whenever data are written in said memory cells; and
   automatic control means for enabling said programming means to execute a data writing program again whenever said verifying means discriminates that a data is not written properly to one of said memory cells,
   said data writing program being executed repeatedly a number of times up to a user-defined maximum program execution number applied externally from outside of the memory device;
   wherein said automatic control means is so configured as to count and store the number of programs executed by said programming means and further output the stored number of executed programs to the outside of the memory device.

9. The device of claim 8, wherein said automatic control means compares the number of programs executed by said programming means with the maximum program execution number applied from the outside of the memory device to decide whether the same program is to be executed again or not on the basis of the comparison result.

10. The device of claim 9, wherein said automatic control means inputs the maximum program execution number from the outside and outputs the number of executed programs to the outside in response to inputted commands, respectively.

11. The device of claim 10, wherein the data writing program is executed for each page.

12. The device of claim 11, wherein the data writing program is executed beginning from a memory cell corresponding to a write start head address of each page.

13. The device of claim 12, wherein a BUSY signal indicative of data write program execution is outputted when the data writing program is being executed.

14. A non-volatile semiconductor memory device, comprising:
   a plurality of memory cells for electrically rewriting data;
   erasing means for erasing data in said memory cells;
   verifying means for discriminating whether or not data is erased in one of said memory cells properly said erasing means whenever data are erased in said memory cells, and
   automatic control means for enabling said erasing means to execute the data erasing operation again whenever said verifying means discriminates that a data is not erased properly in one of said memory cells,
   said data erasing operation being executed repeatedly a number of times up to a user-defined maximum erasing operation number applied externally from outside of the memory device;
   wherein said automatic control means is so configured as to rewrite and store the maximum erasing operation number applied externally.

15. The device of claim 14, wherein said automatic control means is so configured as to count and store the number of erasing operations executed by said erasing means and further output the stored number of executed erasing operations to the outside of the memory device.

16. The device of claim 15, wherein said automatic control means compares the number of erasing operations executed by said erasing means with the maximum erasing operation number applied from the outside of the memory device to decide whether the same erasing operation is to be executed again or not on the basis of the comparison result.

17. The device of claim 16, wherein said automatic control means inputs the maximum erasing operation number from the outside and outputs the number of executed erasing operations to the outside in response to inputted commands, respectively.

18. The device of claim 17, wherein the data erasing operation is executed for each page.

19. The device of claim 18, wherein the data erasing operation is executed beginning from a memory cell corresponding to a write start head address of each page.

20. The device of claim 19, wherein a BUSY signal indicative of data erasing operation is outputted when the data erasing operation is being executed.

21. A non-volatile semiconductor memory device comprising:
  a plurality of memory cells for electrically rewriting data;
  erasing means for erasing data in said memory cells;
  verifying means for discriminating whether or not data is erased in one of said memory cells properly by said erasing means whenever data are erased in said memory cells; and
  automatic control means for enabling said erasing means to execute the data erasing operation again whenever said verifying means discriminates that a data is not erased properly in one of said memory cells,
  said data erasing operation being executed repeatedly a number of times up to a user-defined maximum erasing operation number applied externally from outside of the memory device;
  wherein said automatic control means is so configured as to count and store the number of erasing operations executed by said erasing means and further output the stored number of executed erasing operations to the outside of the memory device.

22. The device of claim 21, wherein said automatic control means compares the number of erasing operations executed by said erasing means with the maximum erasing operation number applied from the outside of the memory device to decide whether the same erasing operation is to be executed again or not on the basis of the comparison result.

23. The device of claim 22, wherein said automatic control means inputs the maximum erasing operation number from the outside and outputs the number of executed erasing operations to the outside in response to inputted commands, respectively.

24. The device of claim 23, wherein the data erasing operation is executed for each page.

25. The device of claim 24, wherein the data erasing operation is executed beginning from a memory cell corresponding to a write start head address of each page.

26. The device of claim 25, wherein a BUSY signal indicative of data erasing operation is outputted when the data erasing operation is being executed.

27. A non-volatile semiconductor memory device, comprising:
  a plurality of memory cells for electrically rewriting data;
  programming means for executing data writing programs to write data to said memory cells;
  verifying means for discriminating whether or not data is written to one of said memory cells properly by said programming means whenever data are written in said memory cells; and
  automatic control means for automatically enabling said verifying means to execute discrimination and enabling said programming means to execute a data writing program again whenever said verifying means discriminates that a data is not written properly to one of said memory cells, said automatic control means executing said data writing program repeatedly without receiving any command from outside of the memory device a number of times up to a user-defined maximum program execution number applied externally from outside of the memory device.

28. The device of claim 27, wherein said automatic control means is so configured as to rewrite and store the maximum program execution number applied externally.

29. The device of claim 28, wherein said automatic control means is so configured as to count and store the number of programs executed by said programming means and further output the stored number of executed programs to the outside of the memory device.

30. The device of claim 29, wherein said automatic control means compares the number of programs executed by said programming means with the maximum program execution number applied from the outside of the memory device to decide whether or not the same program is to be executed again on the basis of the comparison result.

31. The device of claim 30, wherein said automatic control means inputs the maximum program execution number from the outside and outputs the number of executed programs to the outside in response to inputted commands, respectively.

32. The device of claim 27, wherein said automatic control means is so configured as to count and store the number of programs executed by said programming means and further output the stored number of executed programs to the outside of the memory device.

33. The device of claim 32, wherein said automatic control means compares the number of programs executed by said programming means with the maximum program execution number applied from the outside of the memory device to decide whether or not the same program is to be executed again on the basis of the comparison result.

34. The device of claim 33, wherein said automatic control means inputs the maximum program execution number from the outside and outputs the number of executed programs to the outside in response to inputted commands, respectively.

35. A non-volatile semiconductor memory device, comprising:
  a plurality of memory cells for electrically rewriting data;
  erasing means for erasing data in said memory cells;
  verifying means for discriminating whether or not data is erased in one of said memory cells properly by said erasing means whenever data are erased in said memory cells; and automatic control means for automatically enabling said verifying means to execute discrimination and enabling said erasing means to execute the data erasing operation again whenever said verifying means discriminates that a data is not erased properly in one of said memory cells, said automatic control means executing said data erasing operation repeatedly without receiving any command from outside of the memory device a number of times up to a user-defined maximum erasing operation number applied externally outside of the memory device.

36. The device of claim 35, wherein said automatic control means is so configured as to rewrite and store the maximum erasing operation number applied externally.

37. The device of claim 36, wherein said automatic control means is so configured as to count and store the number of erasing operations executed by said erasing means and further output the stored number of executed erasing operations to the outside of the memory device.

38. The device of claim 37, wherein said automatic control means compares the number of erasing operations executed by said erasing means with the maximum erasing operation number applied from the outside of the memory device to decide whether or not the same erasing operation is to be executed again on the basis of the comparison result.

39. The device of claim 38, wherein said automatic control means inputs the maximum erasing operation number from the outside and outputs the number of executed erasing operations to the outside in response to inputted commands, respectively.

40. The device of claim 35, wherein said automatic control means is so configured as to count and store the number of erasing operations executed by said erasing means and further output the stored number of executed erasing operations to the outside of the memory device.

41. The device of claim 40, wherein said automatic control means compares the number of erasing operations executed by said erasing means with the maximum erasing operation number applied from the outside of the memory device to decide whether or not the same erasing operation is to be executed again on the basis of the comparison result.

42. The device of claim 41, wherein said automatic control means inputs the maximum erasing operation number from the outside and outputs the number of executed erasing operations to the outside in response to inputted command, respectively.

* * * * *